United States Patent [19]

Blake et al.

[11] Patent Number: 4,946,799

[45] Date of Patent: Aug. 7, 1990

[54] PROCESS FOR MAKING HIGH PERFORMANCE SILICON-ON-INSULATOR TRANSISTOR WITH BODY NODE TO SOURCE NODE CONNECTION

[75] Inventors: Terence G. W. Blake; Hsindao Lu, both of Dallas, Tex.

[73] Assignee: Texas Instruments, Incorporated, Dallas, Tex.

[21] Appl. No.: 435,135

[22] Filed: Nov. 9, 1989

Related U.S. Application Data

[62] Division of Ser. No. 216,933, Jul. 8, 1988, Pat. No. 4,899,202.

[51] Int. Cl.$^5$ .......................................... H01L 21/336
[52] U.S. Cl. ...................................... 437/41; 437/29; 437/34; 437/45; 437/57; 437/913; 148/DIG. 150; 148/DIG. 77
[58] Field of Search ....................... 437/29, 34, 41, 44, 437/45, 56, 57, 58, 154, 46, 913; 148/DIG. 77, DIG. 150; 357/23.4, 23.7

[56] References Cited

U.S. PATENT DOCUMENTS

| | | | |
|---|---|---|---|
| 4,232,327 | 11/1980 | Hsu | 437/46 |
| 4,312,680 | 1/1982 | Hsu | 437/44 |
| 4,753,896 | 6/1988 | Matloubian | 437/29 |

FOREIGN PATENT DOCUMENTS

| | | |
|---|---|---|
| 0045076 | 4/1981 | Japan . |
| 0076675 | 4/1987 | Japan . |

Primary Examiner—Brian E. Hearn
Assistant Examiner—T. N. Quach
Attorney, Agent, or Firm—Stanton C. Braden; James T. Comfort; Melvin Sharp

[57] ABSTRACT

A process for making a silicon-on-insulator MOS transistor is disclosed which includes forming an implanted region on the source side of the gate electrode for making contact to the body node. A contact region of the same conductivity type as the body node, (for example, a p+ region for an n-channel transistor) is formed within the source region in a self-aligned fashion relative to sidewall oxide filaments on the source side of the gate electrode. The lightly-doped drain extension of the source region remains disposed between the contact region and the body node at the surface, but the contact region extends below the depth of the lightly-doped drain region to make contact to the body node. Ohmic connection is then made between the abutting source region and the contact region, for example by way of silicidation. Since the contact region is of the same conductivity as the body node, a non-rectifying ohmic contact is made between the source and body nodes of the transistor. For SOI CMOS technology, no additional photolithographic or implant steps are required for formation of the contact, as the source/drain implant masks required for the masking of opposite conductivity type regions and the associated implants can be used in the formation of the contact region.

8 Claims, 3 Drawing Sheets

PROCESS FOR MAKING HIGH PERFORMANCE SILICON-ON-INSULATOR TRANSISTOR WITH BODY NODE TO SOURCE NODE CONNECTION

This invention is in the field of integrated circuits, and is specifically directed to insulated-gate field effect transistors formed by silicon-on-insulator (SOI) technology.

This application is related to application Ser. No. 216,932 filed contemporaneously herewith.

This invention was made with Government support under contract No. DNA 001-86-C-0090 awarded by the Defense Nuclear Agency. The Government has certain rights in this invention.

This is a division of application Ser. No. 07/216,933 filed July 8, 1988, now U.S. Pat. No. 4,899,202.

BACKGROUND OF THE INVENTION

Silicon-on-insulator (SOI) technology is becoming of increasing importance in the field of integrated circuits. SOI technology deals with the formation of transistors in a layer of semiconductor material which overlies an insulating layer: the most common embodiment of SOI structures is a single crystal layer of silicon which overlies a layer of silicon dioxide. High performance and high density integrated circuits are achievable using SOI technology because of the reduction of parasitic elements present in integrated circuits formed in bulk semiconductor. For example, for an MOS transistor formed in bulk, parasitic capacitance is present at the junction between the source/drain regions and the underlying substrate, and the possibility of breakdown of the junction between source/drain regions and the substrate region also exists. A further example of parasitic elements are present for CMOS technology in bulk, where parasitic bipolar transistors formed by n-channel and p-channel transistors in adjacent wells can give rise to latch-up problems. Since SOI structures significantly alleviate the parasitic elements, and increase the junction breakdown tolerance of the structure, the SOI technology is well-suited for high performance and high density integrated circuits.

It should be noted that a similar technology to SOI is the silicon-on-sapphire (SOS) technology, which provides similar benefits as those discussed relative to SOI technology above. It should be noted that the invention to be disclosed herein is applicable to SOS structures, as well.

The underlying insulator film in an SOI structure presents certain problems relative to the transistor characteristics, however. In bulk transistors, electrical connection is easily made via the substrate to the body node of an MOS transistor. The relatively fixed bias of the body node provides for a stable threshold voltage relative to the drain-to-source voltage. However, conventional SOI transistors have the body node (i.e., the undepleted volume within the body region underlying the gate electrode) electrically floating, as the body node is isolated from the substrate by the underlying insulator film. Under sufficient drain-to-source bias, impact ionization can generate electron-hole pairs near the drain which, due to the majority carriers traveling to the body node while the minority carriers travel to the drain, cause a voltage differential between the body node and the source of the transistor. This voltage differential lowers the effective threshold voltage and increases the drain current, exhibiting the well known "kink" effect.

Furthermore, the floating body node of the SOI transistor presents a parasitic "back channel" transistor, with the substrate as the gate and the insulator film underlying the transistor as the gate dielectric. This back channel may provide for a drain-source leakage path along the body node near the interface with insulator film. In addition, the dielectrically isolated body node allows capacitive coupling between the body node and the gate, and diode coupling between the body node and the source and drain, to bias the body node and thus affect the threshold voltage. Each of these factors can contribute to undesirable performance shifts in the transistor relative to design, as well as to increased instability of the transistor operating characteristics.

It is therefore an object of this invention to provide an insulated-gate field effect transistor formed in a semiconductor region overlying an insulator, having its body node connected to its source node.

It is another object of this invention to provide such a transistor which can be fabricated with a minimum of additional masking steps.

It is another object of this invention to provide such a transistor which can be fabricated in conjunction with silicide-cladding of the source and drain diffusions.

It is another object of this invention to provide such a transistor which can have the body-to-source connection fabricated in such a way that the specification of source and drain nodes of the transistor can be reversed with a minimum of mask level changes.

It is another object of this invention to provide such a transistor which has the body-to-source connection fabricated in such a way that reduction of the effective channel width of the transistor is minimized.

It is yet another object of this invention to provide such a transistor which has reduced edge leakage due to interfacial dopant diffusion, and which has reduced leakage resulting from exposure to ionizing radiation.

Other objects and advantages of the invention will become apparent to those of ordinary skill in the art having reference to this specification and the accompanying drawings.

SUMMARY OF THE INVENTION

The invention may be incorporated into a silicon-on-insulator insulated-gate field effect transistor which has a graded junction. A highly-doped contact region of a conductivity-type opposite that of the source and drain is formed adjacent to the lightly-doped drain region on the source side of the gate electrode. The contact region may be formed by known techniques, such as implant and diffusion, in a self-aligned fashion after the provision of sidewall oxide filaments along the side of the gate, extending below the lightly-doped drain region on the source side of the transistor. Since the contact region and body node (underlying the gate electrode) are of the same conductivity type, the contact region is electrically connected to the body node. The source region and the body node contact region can then be connected together by way of silicidation of the surface of the structure, thereby connecting the source region to the body node. Since the lightly-doped drain region on the source side of the transistor remains between the contact region and the body node at the surface, the channel width of the transistor is not reduced by the width of the contact region, as would be the case if the contact region were contacting the body node at the surface.

DETAILED DESCRIPTION OF THE PREFERRED EMBODIMENTS

Figure 2:
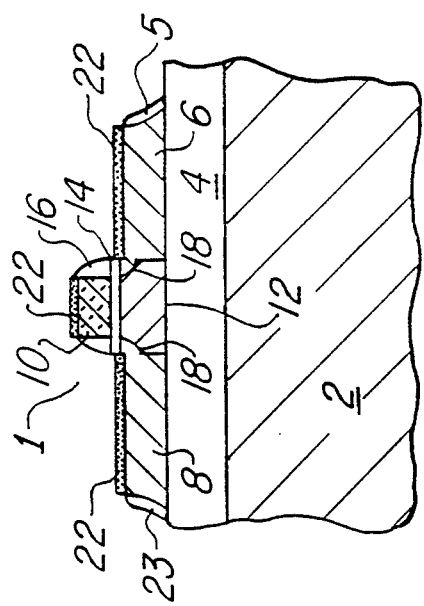
FIGS. 1 and 2 are plan and cross-sectional views, respectively, of a conventional SOI MOS transistor.
Figure 1:
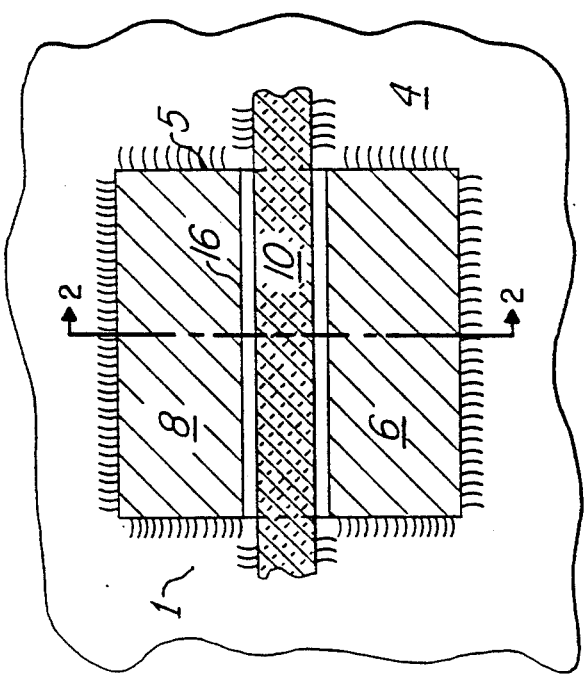

Referring to FIGS. 1 and 2, an n-channel SOI transistor according to the prior art is illustrated in plan view and cross-sectional view, respectively. As shown in FIG. 2, the transistor is formed in a single-crystal silicon mesa 5 overlying an insulator film 4 which is formed on a silicon substrate 2. Insulator film 4 is generally silicon dioxide. The formation of mesa 5 over insulator 4 can be done by any one of a number of known methods such as SIMOX (Separation by Implanted Oxygen), oxidized porous silicon (FIPOS), and thin film zone-melting recrystallization (ZMR). An example of the SIMOX process is described in application Ser. No. 035,126 filed Apr. 7, 1987, and assigned to Texas Instruments Incorporated now U.S. Pat. No. 4,863,878.

Gate insulator 14, such as thermally grown silicon dioxide, deposited silicon nitride, or a combination thereof, is disposed on the surface of single-crystal mesa 5. Gate electrode 10, commonly formed of heavily doped polycrystalline silicon, overlies gate insulator 14, and defines the gate of the MOS transistor of FIGS. 1 and 2. Source region 6 and drain region 8 are heavily-doped n-type regions which are formed by ion implantation and subsequent diffusion. As shown in FIG. 2, this example of a conventional transistor is formed according to the well-known lightly-doped drain construction, with implantation of the lightly-doped regions 18 performed in a self-aligned manner to gate electrode 10 (generally prior to formation of sidewall oxide filaments 16). An example of a method for forming lightly-doped drain transistors by use of sidewall oxide filaments is described in U.S. Pat. No. 4,356,623 issued Nov. 2, 1982, assigned to Texas Instruments Incorporated, and incorporated herein by reference. The heavily doped portions of source and drain regions 6 and 8 of FIGS. 1 and 2 are shown as formed in self-aligned fashion relative to the gate electrode 10 and sidewall oxide filaments 16, and fully extend from the surface of mesa 5 to the interface with insulator 4. Body node region 12 is a p-channel region which is not doped with n-type dopant used to form source and drain regions 6 and 8, but remains at the same conductivity type and concentration (p-type silicon which is lightly doped relative to the dopant concentration of source and drain regions 6 and 8) as originally formed. Sidewall filaments 23 passivate the edges of mesa 5.

It should be noted that a refractory metal silicide film 22, such as titanium disilicide, is shown in FIG. 2 as cladding source and drain regions 6 and 8, as well as gate electrode 10. Such silicidation is useful in reducing the sheet resistance of the semiconducting layers, and is preferably done according to the well-known self-aligned direct react silicidation process, such as is described in U.S. Pat. No. 4,690,730 issued Sep. 1, 1987 and assigned to Texas Instruments Incorporated. Such silicidation is of course not essential to the operation of the transistor. Any one of the well known refractory metals conventionally used in silicidation, such as molybdenum, tungsten, and cobalt, may alternatively be used for formation of silicide film 22.

For transistor 1 of FIGS. 1 and 2, body node 12 is electrically isolated in the transistor of FIGS. 1 and 2. Since source and drain regions 6 and 8 extend through the full thickness of mesa 5 to reach insulator 4, and since the self-alignment of source and drain regions 6 allows body node 12 to exist only under gate electrode 10 (and sidewall oxide filaments 14), it is inconvenient to form a contact to body node 12 in the structure of FIGS. 1 and 2. Accordingly, conventional SOI technology has the body node 12 of each MOS transistor in a floating state.

The floating body node of the SOI transistor 1 presents certain problems in the performance, and performance stability, of the transistor. A first problem is the presence of a parasitic "back channel" transistor, having substrate 2 as a gate electrode and insulator film 4 as the gate dielectric. This back channel may provide for a drain-source leakage path along the body node 12 near the interface with insulator film 4, depending upon the local potential of substrate 2 at the transistor location. In addition, it is well known that the voltage of body node 12 will affect the threshold voltage ($V_t$) of the transistor. While in bulk devices the MOS transistor body nodes are biased by the substrate, the dielectrically isolated body node 12 of transistor 1 of FIGS. 1 and 2 allows capacitive coupling between body node 12 and gate electrode 10, and diode coupling between body node 12 and source and drain regions 6 and 8, to bias body node 12 to an undesired potential. Furthermore, impact ionization occurs when carriers near the drain are at a sufficiently high potential that electron-hole pairs are created which, due to the minority carriers traveling to the source while the majority carriers travel to the drain, cause a voltage differential between body node 12 and source region 6, lowering the effective threshold voltage and increasing the drain current (i.e., the well known "kink" effect).

Figure 3:
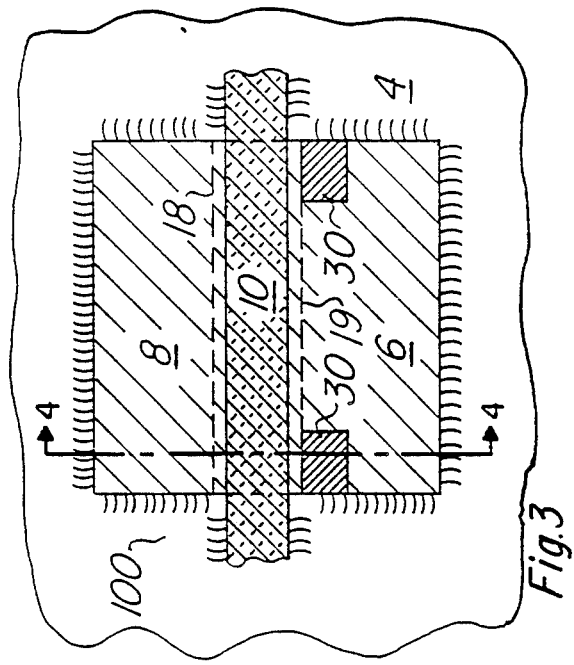
FIG. 3 is a plan view of an SOI MOS transistor constructed according to the invention, prior to silicidation.
Figure 4:
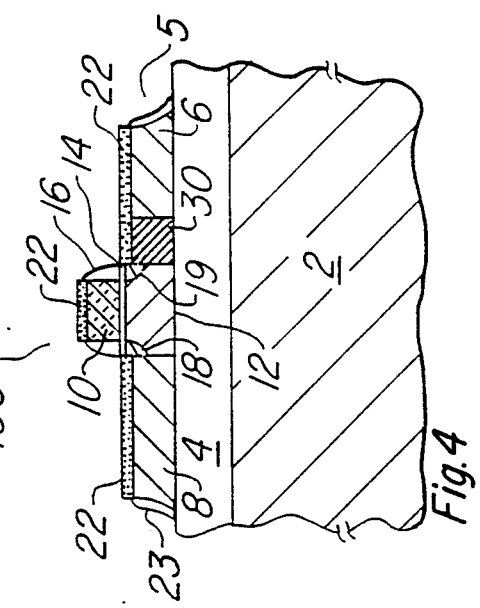
FIG. 4 is a cross-sectional view of the transistor of FIG. 3, subsequent to silicidation.

Referring now to FIGS. 3 and 4, a transistor 100 constructed according to the invention is illustrated; like reference numerals will be used to refer to like elements as used in the conventional transistor 1 of FIGS. 1 and 2. Transistor 100, as will explained hereinbelow, includes a contact between the source and body nodes to alleviate the problems of the floating body node described above relative to conventional transistor 1. The plan view of FIG. 3 shows p+ contact regions 30 at the edge of the mesa, on the source side of gate electrode 10. Sidewall oxide filaments 16 are not shown in the view of FIG. 3, in order to show the presence of n-type lightly-doped drain extension 19 disposed, at the surface, between p+ contact region 30 and gate electrode 10. In this way, the conductive channel of transistor 100 extends along the full length of the edge of gate electrode 10 on the source side, with p+ contact regions 30 spaced away from the conduction channel. It should be noted that the view of FIG. 3 is prior to the silicidation of transistor 100; as will be explained below, silicide cladding is preferably used to connect source region 6 to p+ contact regions 30 at the surface, and thus to provide the electrical connection from source region 30 to body node 12 underlying gate electrode 10. Lightly-doped drain extension 18 is shown on the drain side of gate electrode 10.

It should be noted that placement of p+ contact regions 30 at the edge of the mesa 5 is not essential to provide for contact between the body node 12 and source region 6. However, as described in copending application Ser. No. 150,799 filed Feb. 1, 1988 and assigned to Texas Instruments Incorporated, the presence of p+ contact regions 30 at the edge of the mesa reduces source-drain leakage of the transistor 100 in the event of exposure to ionizing radiation.

Furthermore, it should be noted that the active semiconductor formed over the insulator layer 4 can, for many SOI technologies, contain a relatively large number of dislocation defects compared to the active region in bulk. These dislocations, especially along the edges of silicon mesas such as mesa 5, can allow diffused dopants forming source and drain regions 6 and 8 to diffuse through the body region 12, especially along the edges of mesa 5. This enhanced diffusion can cause short channel effects such as sub-threshold leakage in transistor 100 and, if the diffused dopant extends fully between source region 6 and drain region 8, can short drain region 8 to source region 6. The placement of the contact regions 30 at the edge of mesa 5 reduces the source/drain leakage resulting from such enhanced diffusion by separating the dopant of source region 6 from the edge of mesa 5 at gate electrode 10, so that enhanced diffusion into the body region 12 can come only from the drain side. In addition, placement of contact regions 30 at the edge of the mesa places a p+ region between dopant from drain region 8 which diffuses through body region 12 along the edge of mesa 6, so that dopant reaching fully under gate electrode from drain region 8 will form only a reverse biased diode (contact region 30 being at the same potential as source region 6). Accordingly, the placement of contact regions 30 at the edge of mesa 5 reduces source/drain leakage due to such enhanced interfacial diffusion of the source/drain dopant.

Referring now to FIG. 4, transistor 100 is shown in cross-section. FIG. 4 illustrates that p+ contact region 30 is disposed adjacent n-type lightly-doped drain extension 19 which underlies the sidewall filament 16 on the source side of gate electrode 10. Lightly-doped drain extension 19, since it is n-type, is ohmically connected to n+ source region 6. In this embodiment, similarly as transistor 1 of FIGS. 1 and 2, source region 6 and drain region 8 extend through the full thickness of mesa 5, as does p+ contact region 30. It should be noted that it is not essential for p+ contact region 30 to so fully extend to insulator 4 in order to make contact to body node 12. It should be noted, however, that contact region 30 must extend sufficiently deep to contact the body region which remains under the depletion layer below the channel of transistor 100 when conducting.

FIG. 4 illustrates the provision of silicide film 22 at the surface of the silicon structures (source region 6, p+ contact region 30, drain region 8, and gate electrode 10). While ohmic connection may be made between p+ contact region 30 and source region 6 by way of other interconnection means, such as conventional contacts through an overlying insulator film to a metallization layer, silicide film 22 provides a low resistance connection therebetween without an additional masking step. As is known in the art, the use of sidewall oxide filaments 16, besides assisting in the formation of a graded junction to the transistor, also allows self-aligned silicidation of the source, drain and gate regions with minimized of silicide film 22 on source and drain regions 6 and 8, respectively (as well as p+ contact region 30), shorting to silicide film 22 on the surface of gate electrode 10.

It should further be noted that there is no contact between p+ contact region 30 and drain region 8 in the transistor of FIGS. 3 and 4. Accordingly, p+ contact region 30 can be doped as heavily as practicable in order to achieve the best contact to body node 12, without concern for drain-to-source junction breakdown through p+ region 30. An example of the doping concentration of the regions of transistor 100 according to the invention, with a channel length of 1 micron, uses an impurity concentration of p+ contact regions 30 in the range of $10^{18}$ to $10^{21}/cm^3$, with the body node 12 having an impurity concentration of $10^{17}/cm^3$. Source and drain regions 6 and 8 generally can have an impurity concentration of $10^{19}$ to $10^{21}/cm^3$, with lightly-doped drain extensions 18 and 19 in the range of $10^{18}$ to $10^{20}/cm^3$, depending upon the dopant gradient desired.

Figure 5A:
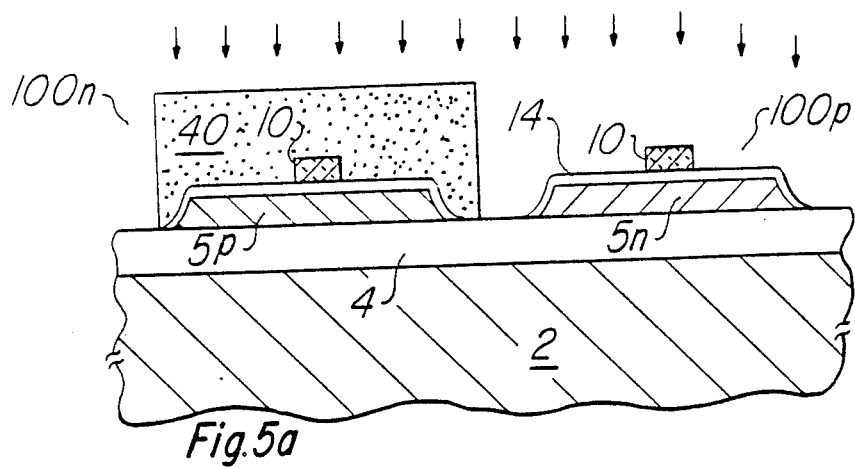
FIGS. 5a through 5e are cross-sectional views illustrating the fabrication of p-channel and n-channel transistors according to the invention.

Referring now to FIGS. 5a through 5e, the steps in the formation of an n-channel transistor 100n and an p-channel transistor 100p, as would be formed in a CMOS circuit, will be described. The cross-sectional views of FIGS. 5a through 5e are taken in a location analogous to that of FIG. 4, i.e., through the portion of the transistors 100 which will have the source-to-body contact. In FIG. 5a, two mesas 5n and 5p are illustrated as formed overlying insulator layer 4; mesa 5n is n-type silicon and mesa 5p is p-type silicon. Gate oxide 14 is present over each mesa 5n and 5p, as is a patterned polysilicon gate electrode 10; accordingly, the structures of FIG. 5a are ready for formation of source and drain regions 6 and 8, as well as contact regions 30. FIG. 5a illustrates a masking layer 40 overlying certain portions of the structures, and exposing portions thereof into which a p-type implant is to be made to form the lightly-doped drain extensions 18p and 19p for p-channel transistor 100p. Masking layer 40 may be patterned and developed photoresist or may be a hard mask layer, such as conventionally used for blocking ion implantation. The pattern of masking layer 40 is preferably designed so that masking layer 40 can overlap gate electrodes 10, and to overlap the edge of the mesas 5, for maximum alignment tolerance. As shown in FIG. 5a, the structure is exposed to a p-type implant of boron of another p-type dopant, to form the lightly-doped drain extensions 18 and 19, using conventional doses and energies for such an implant.

Figure 5B:
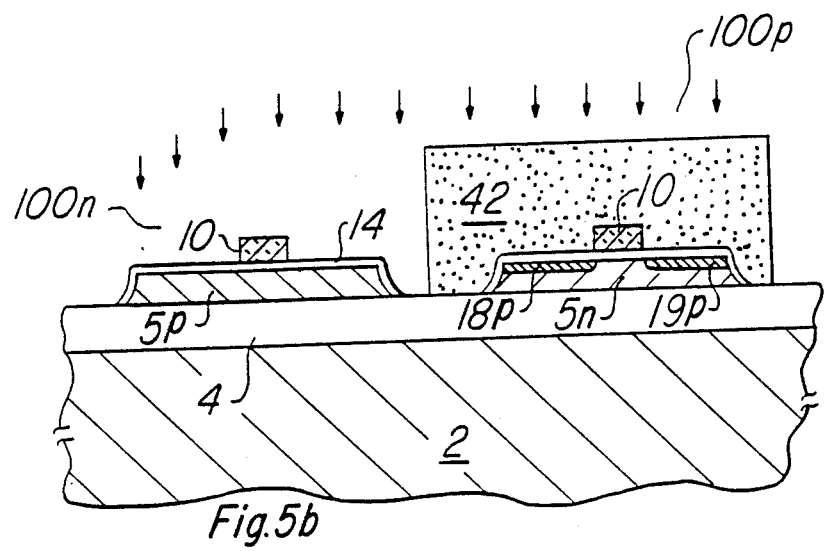

Referring to FIG. 5b, the structure is shown after the implantation of FIG. 5a, and after the formation of masking layer 42 which is to protect the regions into which the p-type implant of FIG. 5a has been made and to expose the regions of the structures into which the n-type lightly-doped drain implant is to be made. FIG. 5b shows lightly-doped drain extensions 18p and 19p are driven approximately to their final depth. It should be noted that each of the implants shown in FIGS. 5a through 5b may not be driven immediately after each masking step, but that a single drive-in anneal may be done after all four of the implants described herein are performed. The point at which the drive-in anneal or anneals are done is not critical to the fabrication of the structures according to the invention; drive-in after each implant is shown in FIGS. 5a through 5d for purposes of clarity of explanation of the masking steps, however. FIG. 5b illustrates the structures as receiving the n-type (arsenic, phosphorous, or other conventional dopants) lightly-doped drain implant, in conventional doses and energies.

Figure 5C:
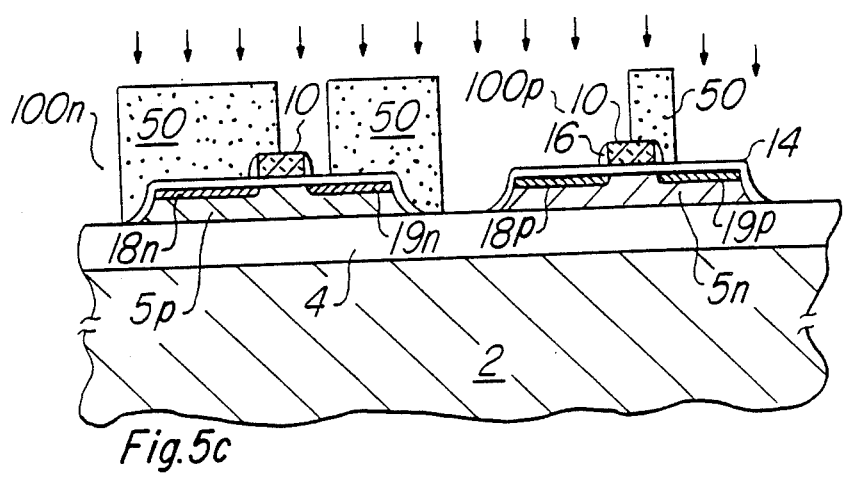

Referring now to FIG. 5c, transistors 100n and 100p are shown at the point of receiving the heavy p-type source/drain implant. Sidewall oxide filaments 16 are in place adjacent the sides of gate electrodes 10, to protect a portion of region 19p in transistor 100p, and to protect region 19n in transistor 100n, from the heavy source/drain implant so that a graded junction will result. Sidewall oxide filaments 16 are formed by way of deposition of an oxide layer, such as by decomposition of TEOS, followed by an anisotropic etch of the oxide to leave the sidewall filaments 16 behind, as described in the above-referenced U.S. Pat. No. 4,356,623. Mask layer 50 is formed to protect the n-type implanted regions 18n and most of region 19n from the p-type source/drain implant. A portion of region 19n adjacent sidewall oxide filament 16 is not protected by mask layer 50, so that p+ contact region 30p (shown later) can be formed by the p-type source/drain implant. Mask layer 50 also exposes the p-type implanted regions 18p and most of region 19p (except as protected by filaments 16) to the p+ source/drain implant; a portion of region 19p adjacent sidewall oxide filament 16 is protected by mask layer 50, so that the implant required to form n+ contact region 30n (shown later) will not need to counterdope the p+ source/drain implant. The p-type source/drain implant is then performed, as illustrated in FIG. 5c, according to conventional doses and energies for such an implant.

Figure 5D:
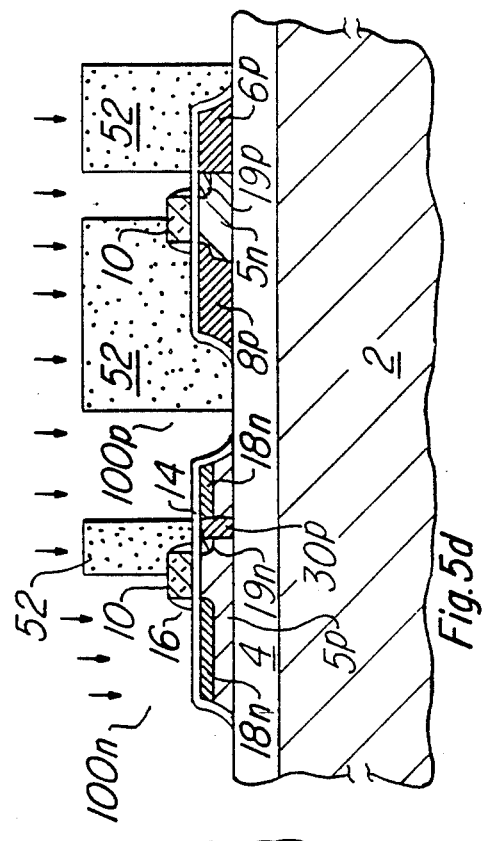

FIG. 5d illustrates the presence of source region 6p and drain region 8p in transistor 100p, and the presence of p+ contact region 30p in transistor 100n for contact to the body node of transistor 100n. Also shown in FIG. 5d is the final source/drain pattern mask layer 52 for protecting the p+ regions 6p, 8p and 30p from the n-type source/drain implant, and for exposing the regions of transistors 100n and 100p that are to receive the implant. The implant of FIG. 5d will thus eventually form the source and drain regions 6n and 8n, respectively, of transistor 100n, and will also form an n+ contact region 30n for contact between source region 6p and the body node of transistor 100n, analogous to the p+ contact region 30 in transistor 100 shown in FIGS. 3 and 4.

Figure 5E:
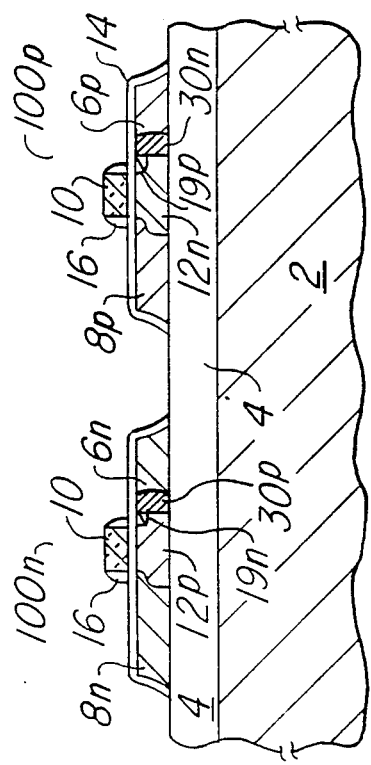

The result of the implant of FIG. 5d, after the drive-in anneal, is shown in FIG. 5e. Source region 6n and drain region 6n are formed in transistor 100n, similarly as shown in FIG. 4. In p-channel transistor 100p, n+ contact region 30n is adjacent p-type lightly-doped drain extension 19p, to make contact between source region 6p and body node 12n of transistor 100n when silicided. The structure of FIG. 5e is then subjected to the direct react silicidation process, as described hereinabove, to result in the ohmic connection between the source nodes 6p and 6n to body nodes 12n and 12p, respectively, through the respective contact regions 30n and 30p.

As is evident from the steps illustrated in FIGS. 5a through 5e, no additional mask steps are required for the formation of the source-to-body contact according to the invention when incorporated into an SOI CMOS process. It should be noted that the order in which the implants are done (i.e., p-type prior to n-type) is arbitrary. The resultant structure may be equivalently formed by performing the n-type implants prior to the p-type, if desired.

Figure 6:
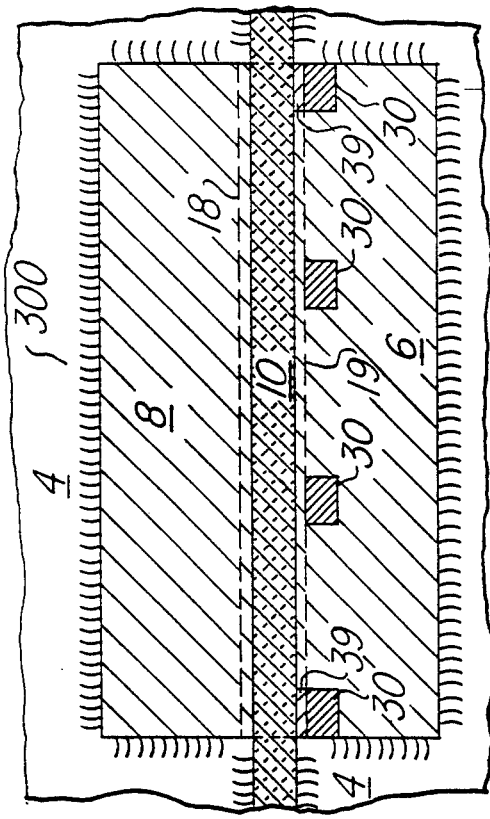
FIG. 6 is a plan view of an SOI MOS transistor constructed according to a second embodiment of the invention.

FIG. 6 illustrates, in plan view, a transistor 200 constructed according to a second embodiment of the invention. Transistor 200, similarly as transistor 100 in FIG. 3, is shown prior to the silicidation for connecting p+ contact regions 30 to source region 6. Transistor 200 has multiple p+ contact regions 30, placed not only at the edge of mesa 5, but also in the interior of transistor 200. For those SOI transistors, such as transistor 200, which are required to have additional drive capability by having an increased channel width-to-length ratio, body node 12 may not receive a uniform bias from source region 6 through p+ contact region 30 over such a relatively long width due to its relatively light doping concentration. Accordingly, the interior ones of p+ contact regions 30 are provided to more uniformly bias the entire width of the underlying body node 12. Characterization of transistors fabricated according to a given set of process parameters and geometries may indicate that contact regions 30 must be spaced apart mo greated than a certain distance to provide such constant bias. This may then result in contact regions 30 spaced apart by no more than a particular distance, although the spacing of such plural contact regions 30 may not necessarily be uniform as suggested by the view of FIG. 6.

It should be further noted that, for particularly narrow transistors, a single contact region 30, at one edge of source region 6, may be sufficient to bias the body node 12 uniformly. Since each contact region 30 reduces the effective channel width of the transistor, it is preferable to minimize the number and size of contact regions 30 to the minimum necessary to provide sufficiently uniform bias to body node 12.

It should further be noted that the contact regions 30 provided according to the invention do not require additional patterning in the formation of the mesas 5 or the gate electrodes 10 except for the masks used during the implant steps. Accordingly, it is not necessary to specify which side of the transistor is to be the source and which is to be the drain until the implant steps are performed. The instant invention is thus particularly advantageous in the formation of transistors in gate arrays and other mask-programmable logic, as the masks used to form the mesas 5 and gates 10 may be common to all devices fabricated with the same process, with the personalization of the gate array (and specification of source and drain) done by way of the implant masks. In addition, such devices may include transistors to which body node contact is not desired, such as a pass transistor, in which case the contact regions 30 may be precluded using the same implant mask levels.

The transistors described herein, due to the provision of lightly-doped drain region 19 of the same conductivity type as source region 6 between contact regions 30 and the body node 12 at the surface of the transistors, provides for body-to-source connection without a reduction in the channel width of the transistor. A slight increase in the series "on" resistance of the transistors necessarily results from this construction, as the current flow through the portions of the lightly-doped drain region 19 adjacent contact regions 30 will be required to travel a longer path therethrough to reach the more heavily doped source region 6. It should be noted, however, that this increase in series resistance will be minimal, as the increased resistance is in parallel with the low resistance current path in the locations at which lightly-doped drain region 19 is adjacent source region 6. Therefore, the instant invention provides body-to-source connection without a reduction in the channel width, with minimal impact on the source/drain resistance of the transistor when conducting.

Figure 7:
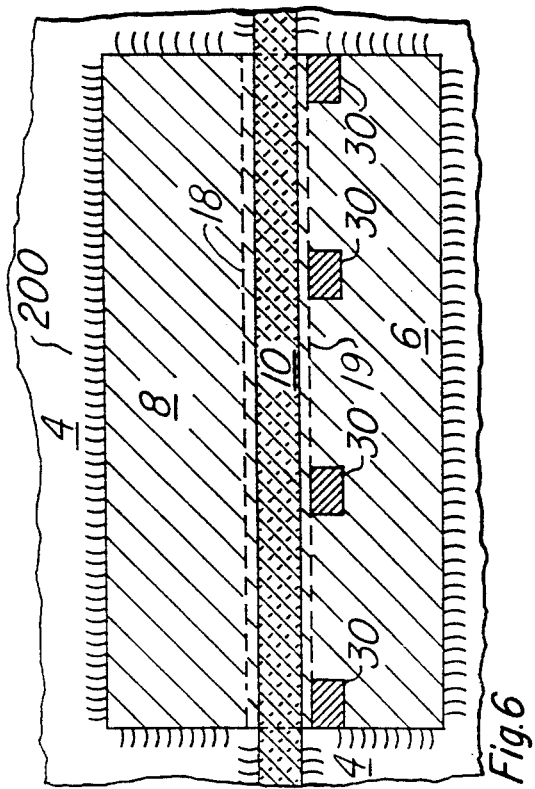
FIG. 7 is a plan view of an SOI MOS transistor constructed according to a third embodiment of the invention.

Referring now to FIG. 7, a plan view of another embodiment of the invention is shown. As described above, edge leakage of an SOI transistor due to enhanced diffusion of the drain dopant, especially along the edges of mesa 5, is reduced by the placement of contact regions 30 at the edges of mesa 5. Since the enhanced diffusion causing the edge leakage can occur not only at the bottom of mesa 5 (i.e., at the interface with insulator layer 4), but also at the top surface under gate dielectric 14, reduction of edge leakage is further reduced in transistor 300 shown in FIG. 7. Transistor 300 has lightly-doped drain extension regions 19 of the same conductivity type as source region 6 (in this example, n-type) disposed at the surface between the ones of contact regions 30 which are in the interior of transistor 300 and body region 12 underlying gate electrode 10. For the ones of contact regions 30 at the edges of mesa 5 in transistor 300, however, lightly-doped drain extensions 39 of the same conductivity type as contact regions 30 (in this example, p-type) are provided at the surface of the structure. In this way, edge leakage may be minimized by removal of a dopant source for enhanced diffusion (i.e., the dopant diffusion from regions 39 is of the same conductivity type as body region 12), and by providing diode isolation also at the top surface of mesa 5 in the event of such enhanced diffusion. The overall channel width is of course reduced by the provision of lightly-doped drain extensions 39, but only for those ones of contact regions 30 at the edges of mesa 5.

Transistor 300 of FIG. 7 can be fabricated by substantially the same process as transistors 100 and 200 described hereinabove, except that the locations at which regions 39 are to be formed must be masked from receiving the lightly-doped drain implant provided for source and drain regions 6 and 8, and must of course be exposed to a lightly-doped drain implant of the opposite conductivity type.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A method of fabricating an integrated circuit in a semiconductor layer overlying an insulating film, comprising:
    defining first and second portions of said semiconductor layer, said first and second portions of first and second conductivity types, respectively;
    forming a gate electrode over each of said first and second portions;
    applying a first mask layer over said first portion to cover source and drain regions adjacent the gate electrode over said first portion;
    doping source and drain locations of said second portion adjacent said gate electrode with a dopant of said first conductivity type;
    applying a second mask layer over said second portions to cover the source and drain regions of said second portion;
    doping the source and drain locations of said first portion adjacent said gate electrode with a dopant of said second conductivity type;
    forming sidewall dielectric filaments on the sides of said gate electrodes to cover a portion of the semiconductor layer adjacent to the gate electrodes;
    applying a third mask layer over said first and second portions to expose a contact region of said first portion adjacent said sidewall filament on the source side of said gate electrode, and the source and drain regions of said second portion, and to cover a contact region of said second portion adjacent said sidewall filament on the source side of said gate electrode, and the source and drain regions of said first portion;
    additionally doping the exposed locations of said first and second portions with a dopant of said first conductivity type;
    applying a fourth mask layer over said first and second portions to expose the contact region of said second portion and the source and drain regions of said first portion, and to cover said contact region of said first portion and the source and drain regions of said second portion;
    additionally doping the exposed locations of said first and second portions with a dopant of said second type; and
    forming a silicide film over the source and contact regions of said first and second portions.

2. The method of claim 1, wherein said doping steps comprise:
    implanting dopant ions of said first conductivity type into the portions exposed by the first mask layer;
    implanting dopant ions of said second conductivity type into the portions exposed by the second mask layer; and
    annealing to diffuse the implanted ions.

3. The method of claim 1, wherein said doping steps dope the doped portions of the semiconductor layer throughout its thickness.

4. The method of claim 1, wherein said additionally doping doping more highly dope the semiconductor layer than said doping steps.

5. The method of claim 1, wherein said defining step comprises forming semiconductor mesas on said insulating film.

6. A method of fabricating an integrated circuit in a semiconductor layer overlying an insulating film, comprising:
    defining an active portion of said semiconductor layer of a first conductivity type;
    forming a gate electrode over said active portion;
    doping source and drain locations of said active portion adjacent said gate electrode with a dopant of a second conductivity type;
    forming sidewall dielectric filaments on the sides of said gate electrode to cover a portion of said active portion adjacent to the gate electrodes;

applying a first mask layer over said active portions to cover a contact region of said active portion adjacent said sidewall filament on the source side of said gate electrode and to expose source and drain regions of said active portion;

doping the source and drain regions exposed by said first mask layer with a dopant of said second conductivity type;

applying a second mask layer to expose said contact region and to cover said source and drain regions;

doping the contact region exposed by said second mask layer with a dopant of said first conductivity type; and forming a silicide film over the source and contact regions.

7. The method of claim 6, wherein said steps of applying a first mask layer and doping the source and drain regions exposed by said first mask layer precede the steps of applying a second mask layer and doping the contact region.

8. The method of claim 7, wherein said steps of applying a second mask layer and doping the contact region precede the steps of applying a first mask layer and doping the source and drain regions exposed by said first mask layer.

* * * * *